(12) United States Patent
Wada et al.

(10) Patent No.: US 10,992,124 B2
(45) Date of Patent: Apr. 27, 2021

(54) SHORT CIRCUIT PROTECTION CIRCUIT FOR SEMICONDUCTOR SWITCHING ELEMENT

(71) Applicant: Mitsubishi Electric Corporation, Tokyo (JP)

(72) Inventors: Yukihiko Wada, Chiyoda-ku (JP); Shota Morisaki, Chiyoda-ku (JP)

(73) Assignee: MITSUBISHI ELECTRIC CORPORATION, Tokyo (JP)

(*) Notice: Subject to any disclaimer, the term of this patent is extended or adjusted under 35 U.S.C. 154(b) by 0 days.

(21) Appl. No.: 16/607,102

(22) PCT Filed: Feb. 22, 2018

(86) PCT No.: PCT/JP2018/006359
§ 371 (c)(1),
(2) Date: Oct. 22, 2019

(87) PCT Pub. No.: WO2019/008817
PCT Pub. Date: Jan. 10, 2019

(65) Prior Publication Data
US 2020/0395747 A1 Dec. 17, 2020

(30) Foreign Application Priority Data
Jul. 3, 2017 (JP) .............................. JP2017-130149

(51) Int. Cl.
*H02H 3/08* (2006.01)
*H02H 1/00* (2006.01)
(Continued)

(52) U.S. Cl.
CPC ............ *H02H 3/08* (2013.01); *H02H 1/0007* (2013.01); *H02H 9/041* (2013.01); *H03F 3/45475* (2013.01)

(58) Field of Classification Search
CPC ........ H02H 3/08; H02H 1/0007; H02H 9/041; H02H 7/205; H03F 3/45475
(Continued)

(56) References Cited

U.S. PATENT DOCUMENTS 5,467,242 A * 11/1995 Kiraly ................ H03K 17/0828
361/101
10,700,678 B2 * 6/2020 Horiguchi ............... H02M 1/00
(Continued)

FOREIGN PATENT DOCUMENTS

| JP | 2008-154372 A | 7/2008 |
| JP | 2015-104208 A | 6/2015 |
| WO | 2016/038717 A1 | 3/2016 |

OTHER PUBLICATIONS

International Search Report and Written Opinion dated Apr. 3, 2018 for PCT/JP2018/006359 filed on Feb. 22, 2018, 9 pages including English Translation of the International Search Report.

*Primary Examiner* — Dharti H Patel
(74) *Attorney, Agent, or Firm* — Xsensus LLP

(57) ABSTRACT

In a short circuit protection circuit, a first gate resistor is connected between a first output node of a gate driver and a first gate terminal. A first real-time control circuit operates to decrease a potential of the first gate terminal when the first real-time control circuit detects that a short circuit current passes through a first semiconductor switching element. The operation monitoring circuit includes a differential voltage circuit configured to output a potential difference between a potential proportional to a potential difference across the first gate resistor and the potential of a first power supply. The operation monitoring circuit monitors, based on an output of the differential voltage circuit, whether the first real-time control circuit is in operation.

10 Claims, 14 Drawing Sheets

(51) Int. Cl.
*H02H 9/04* (2006.01)
*H03F 3/45* (2006.01)

(58) Field of Classification Search
CPC ...... H03K 17/0822; H03K 2217/0027; H02M 1/088; H02M 2001/0009; H02M 1/32; H02M 1/00; H02M 1/08
USPC .......................................................... 361/100
See application file for complete search history.

(56) References Cited

U.S. PATENT DOCUMENTS

| | | | |
|---|---|---|---|
| 2008/0304197 A1* | 12/2008 | Higashi .............. | H03K 17/0828 361/93.7 |
| 2013/0088096 A1* | 4/2013 | Hashimoto ........ | H03K 17/0828 307/131 |
| 2015/0155699 A1* | 6/2015 | Yasusaka ........... | H03K 17/0822 361/101 |
| 2017/0288385 A1* | 10/2017 | Naka .................. | H03K 17/0822 |
| 2019/0260200 A1* | 8/2019 | Sawano .............. | H02H 7/1213 |
| 2020/0127657 A1* | 4/2020 | Masuhara ............ | H02M 1/08 |

* cited by examiner (A) RTC CIRCUIT OPERATES (B)

SHORT CIRCUIT PROTECTION CIRCUIT FOR SEMICONDUCTOR SWITCHING ELEMENT

CROSS-REFERENCE TO RELATED APPLICATIONS

The present application is based on PCT filing PCT/JP2018/006359, filed Feb. 22, 2018, which claims priority to JP 2017-130149, filed Jul. 3, 2017, the entire contents of each are incorporated herein by reference.

TECHNICAL FIELD

The present disclosure relates to a short circuit protection circuit for protecting a semiconductor switching element by stopping a drive of the element when a short circuit occurs during the drive.

BACKGROUND ART

When a short circuit occurs during a drive of a semiconductor switching element, particularly a power semiconductor switching element used for power control, it is necessary to quickly stop driving the element to turn off the element. In order to achieve this, it is necessary to both detect an occurrence of a short circuit without delay and, in response to the detection, stop driving the semiconductor switching element without delay.

An RTC (Real-Time Control) circuit is known as a circuit for detecting that a short circuit occurs. The RTC circuit monitors a current passing through a sense cell for extracting a part of a current in a semiconductor switching element, and immediately lowers the gate voltage of the semiconductor switching element when the sense cell's current is excessive. PTL 1 describes an existing technology by which whether the RTC circuit has operated is determined by monitoring a gate current and accordingly, driving the semiconductor switching element is stopped.

CITATION LIST

Patent Literature

PTL 1: WO2016/038717

SUMMARY OF INVENTION

Technical Problem

As a result of examining the short circuit protection circuit disclosed in PTL 1 described above, the present inventors have found that in the case where a short-circuit failure has occurred when a semiconductor switching element is switched from the off state to the on state, the short circuit is detected with a delay and accordingly, a protective operation is delayed, and the semiconductor switching element may not be protected within a required period of time.

Moreover, PTL 1 does not discuss a case with semiconductor switching elements connected in parallel. The present inventors have found that simply applying the short circuit protection circuit described in PTL 1 to semiconductor switching elements connected in parallel decreases voltage generated in a gate resistor, which leads to delayed detection of a short circuit and may result in a delayed protective operation.

A result of consideration above by the present inventors will be described in detail in the following detailed description of the invention. This disclosure takes the above issues into consideration, and a main object thereof is to provide a short circuit protection circuit capable of detecting without delay that a short circuit has occurred, and quickly protecting the semiconductor switching element.

Solution to Problem

According to one embodiment, a short circuit protection circuit protects a first semiconductor switching element, the first semiconductor switching element having a first gate terminal and turned on by receiving a potential of a first power supply at the first gate terminal from a first output node of a gate driver. The short circuit protection circuit comprises a first gate resistor, a first real-time control circuit, and an operation monitoring circuit. The first gate resistor is connected between the first output node of the gate driver and the first gate terminal. The first real-time control circuit operates to decrease a potential of the first gate terminal when the first real-time control circuit detects that a short circuit current passes through the first semiconductor switching element. The operation monitoring circuit includes a differential voltage circuit configured to output a potential difference between a potential proportional to a potential difference across the first gate resistor and the potential of the first power supply. The operation monitoring circuit monitors, based on an output of the differential voltage circuit, whether the first real-time control circuit is in operation.

According to another embodiment, the short circuit protection circuit further protects a second semiconductor switching element. The second semiconductor switching element has a second gate terminal and turned on by receiving the potential of the first power supply at the second gate terminal from the first output node of the gate driver. In that case, the short circuit protection circuit further comprises a second gate resistor and a second real-time control circuit. The second gate resistor is connected between the first output node of the gate driver and the second gate terminal. The second real-time control circuit operates to decrease a potential of the second gate terminal when the second real-time control circuit detects that a short circuit current passes through the second semiconductor switching element. The differential voltage circuit is further configured to output a potential difference between a potential proportional to a potential difference across the second gate resistor and the potential of the first power supply.

Advantageous Effects of Invention

According to one embodiment described above, the operation of the differential voltage circuit is not affected by an in-phase component of the potentials at the opposite ends of a gate resistor, so that there is substantially no delayed operation attributed to charging/discharging of parasitic capacitance. Therefore, it is possible to detect an occurrence of a short circuit without delay in a semiconductor switching element and quickly perform a protective operation.

According to another embodiment described above, a gate resistor is provided for each semiconductor switching element, and, based on a potential difference across each gate resistor, an operation of a respectively associated real-time control circuit can be monitored. Therefore, even when a plurality of semiconductor switching elements are connected in parallel, the semiconductor switching elements can be protected at high speed.

DESCRIPTION OF EMBODIMENTS

Hereinafter, each embodiment will specifically be described with reference to the drawings. Note that identical or equivalent components are identically denoted and may not be described redundantly.

Introduction

Figure 2:
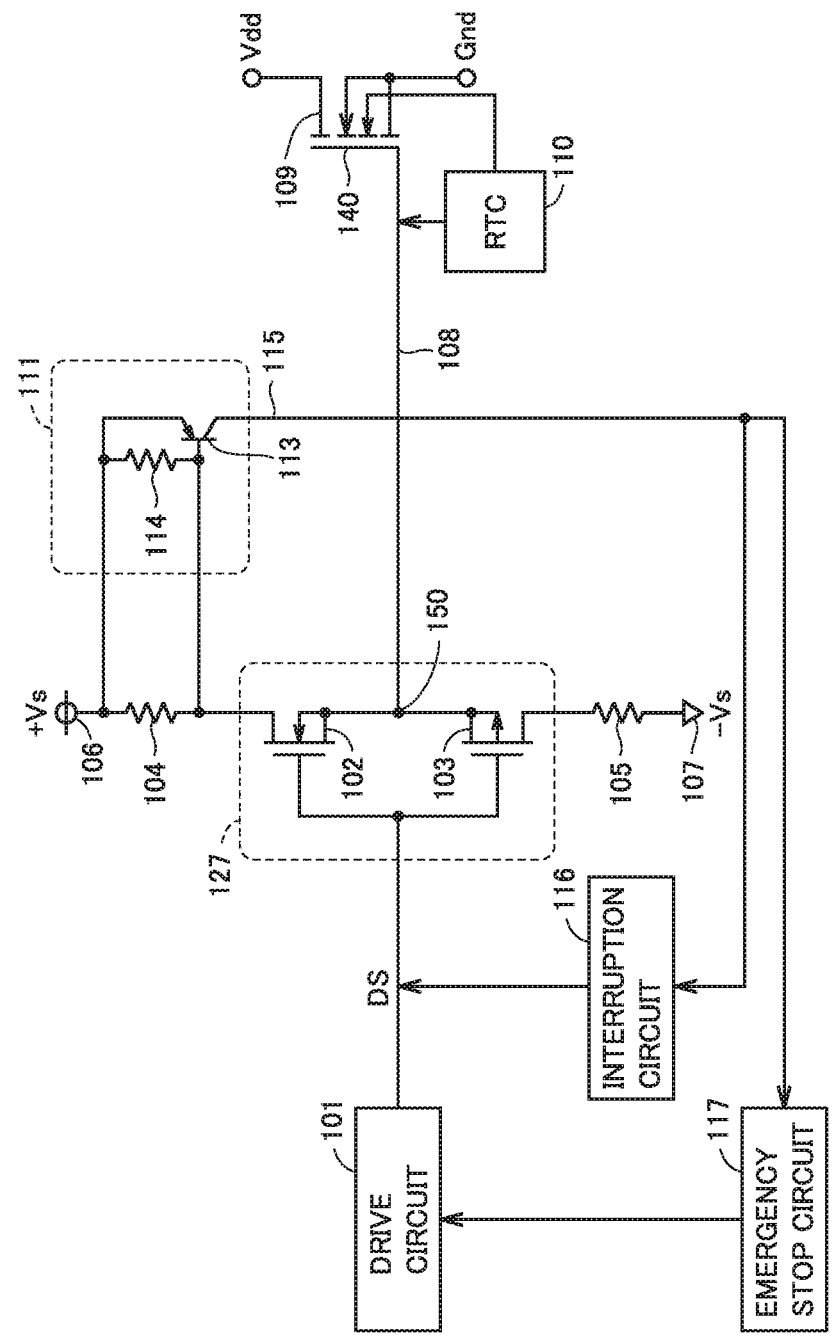
FIG. 2 is a circuit diagram showing a configuration of a short circuit protection circuit for a semiconductor switching element as Comparative Example 2.
Figure 3:
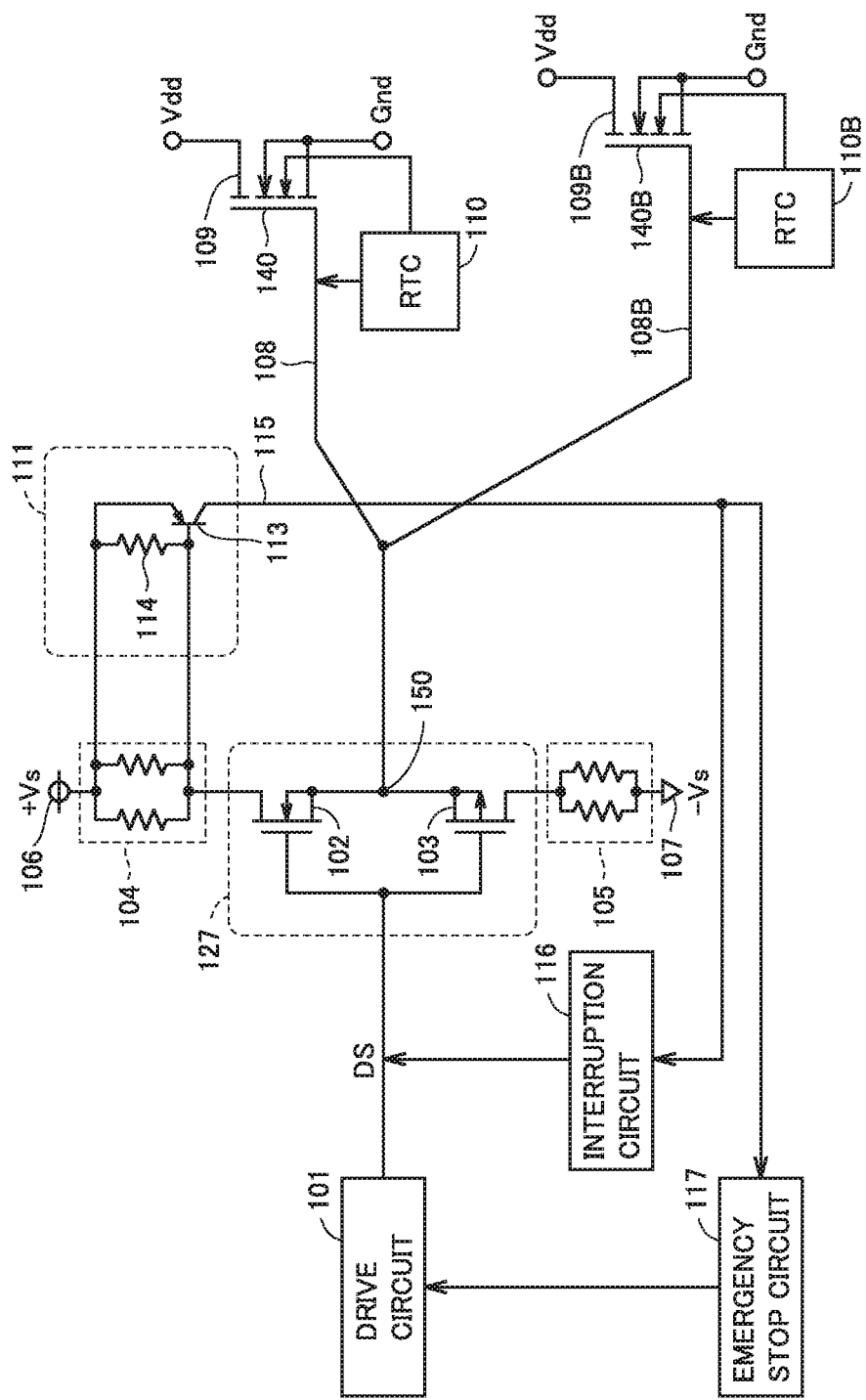
FIG. 3 is a circuit diagram showing a configuration in which semiconductor switching elements are arranged in parallel in FIG. 2.

First, an issue of the short circuit protection circuit described in PTL 1 will be described with reference to FIGS. 1 to 3. The circuit diagrams of FIGS. 1 to 3 are intended as a comparative example for comparison with each embodiment of the present invention, and although they are relevant to the short circuit protection circuit disclosed in PTL 1, they are not identical to the circuit disclosed in the document.

Comparative Example 1

Figure 1:
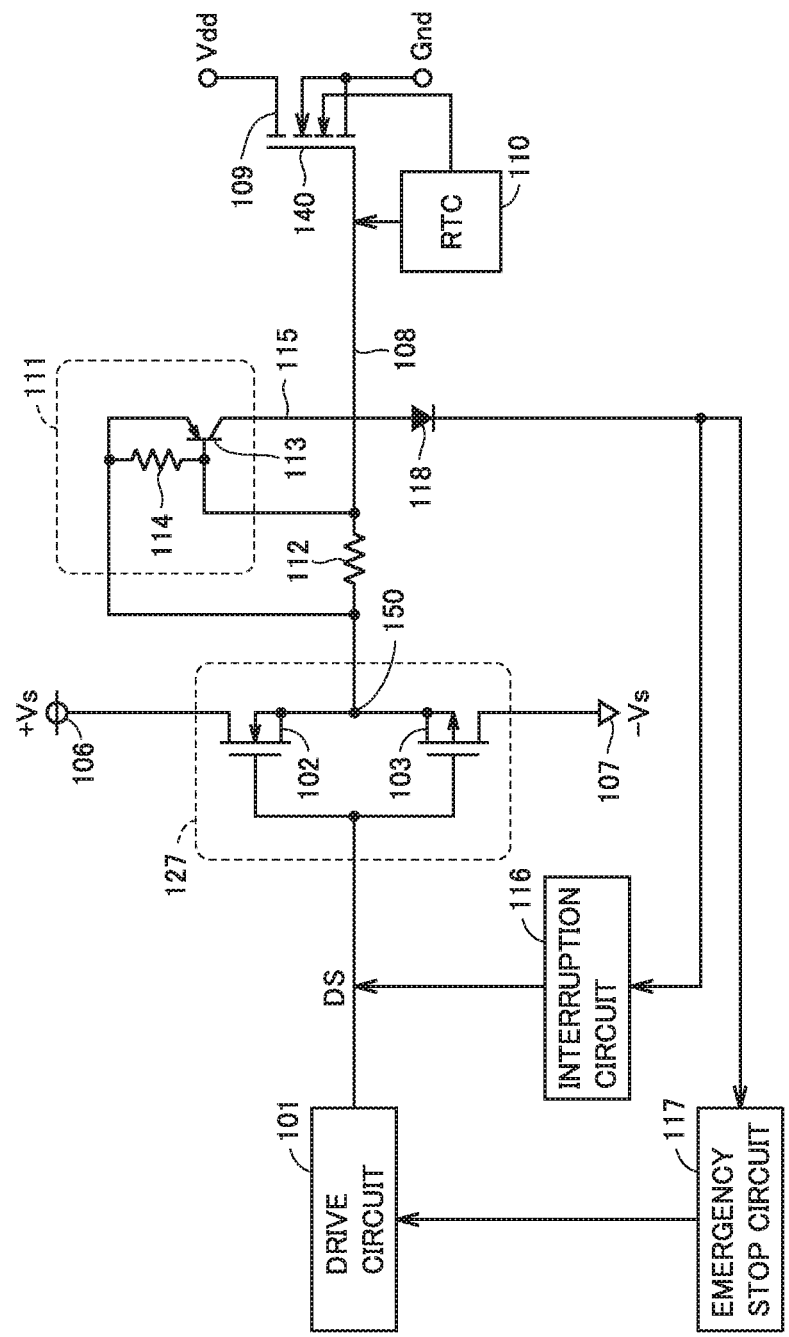
FIG. 1 is a circuit diagram showing a configuration of a short circuit protection circuit for a semiconductor switching element as Comparative Example 1.

FIG. 1 is a circuit diagram showing a configuration of a short circuit protection circuit for a semiconductor switching element as Comparative Example 1. The circuit diagram of FIG. 1 corresponds to FIG. 7 of PTL 1.

Referring to FIG. 1, a drive circuit 101 outputs a drive signal DS which is input to a gate driver 127. Gate driver 127 includes gate output transistors 102 and 103. Transistor 102 is an N-channel MOSFET (Metal Oxide Semiconductor Field Effect Transistor), and its drain terminal is connected to a positive power supply 106. Transistor 103 is a P-channel MOSFET, and its drain terminal is connected to a negative power supply 107.

The source terminal of transistor 102 and the source terminal of transistor 103 are coupled to each other via a connection node 150. Connection node 150 is connected to a gate terminal 140 of a semiconductor switching element 109 via a gate wiring 108. Gate wiring 108 is provided with a gate resistor 112.

Semiconductor switching element 109 has a sense cell incorporated therein. The sense cell is also referred to as a sense electrode. A real-time control (RTC) circuit 110 as a first protection circuit is connected to the sense cell. RTC circuit 110 determines the magnitude of a current passing through the sense cell, and when RTC circuit 110 determines that the current is an overcurrent, RTC circuit 110 operates to lower the gate voltage of the semiconductor switching element.

By urgently lowering the gate voltage, RTC circuit 110 prevents destruction of semiconductor switching element 109. Although RTC circuit 110 limits a short-circuit current of semiconductor switching element 109, the short-circuit current is not completely interrupted, and semiconductor switching element 109 may eventually be overheated and destroyed. Accordingly are prepared an interruption circuit 116 that detects that RTC circuit 110 operates, and interrupts drive signal DS, and an emergency stop circuit 117 that finally stops drive circuit 101. Interruption circuit 116 and emergency stop circuit 117 need to operate immediately after RTC circuit 110 operates.

In general, some type of RTC circuit 110 issues an SC (Short Circuit) signal for notifying interruption circuit 116 and emergency stop circuit 117 that a short circuit has been detected. However, the SC signal is easily contaminated by noise, and accordingly, a filter is required to eliminate noise. In a noisy environment where the filter's time constant has to be increased, it takes time to determine the SC signal and the protective operation would be delayed.

In order to avoid the above problem, there is a method in which a gate current is monitored to detect that RTC circuit 110 operates, and this method is described in PTL 1. The gate current is driven by a strong positive power supply 106, and accordingly, it is unsusceptible to noise. As the method of monitoring the gate current, there is a method of monitoring a voltage generated in gate resistor 112 when semiconductor switching element 109 is on.

In this method, an operation monitoring circuit 111 is prepared as a second protection circuit, and gate resistor 112 has its opposite end terminals connected to the base and emitter terminals, respectively, of a PNP transistor 113 in operation monitoring circuit 111. Furthermore, a resistive element 114 having a relatively large resistance value is connected between the base and emitter of PNP transistor 113.

Operation monitoring circuit 111 specifically operates, as follows: Since the base potential is pulled up to the emitter potential by resistive element 114, PNP transistor 113 is normally off. When a short circuit occurs in semiconductor switching element 109 and RTC circuit 110 operates, the gate potential of semiconductor switching element 109 is mandatorily lowered, and accordingly, the gate current increases. This increased gate current increases a potential difference across gate resistor 112. This increases a potential difference between the base and emitter of PNP transistor 113 connected to gate resistor 112, and, as a result, PNP transistor 113 is turned on. Once PNP transistor 113 is turned on, the voltage Vs of positive power supply 106 is input to interruption circuit 116 and emergency stop circuit 117 via a collector terminal 115 of PNP transistor 113. Interruption circuit 116 and emergency stop circuit 117 having received positive voltage Vs operate to interrupt drive signal DS and stop drive circuit 101, respectively.

In the circuit of FIG. 1, when semiconductor switching element 109 is in the off state, transistor 103 is in the on state, and accordingly, semiconductor switching element 109 has a gate potential lowered to the potential of negative power supply 107, i.e., −Vs. For this reason, gate resistor 112 are at the potential of negative power supply 107 (−Vs) thereacross, and accordingly, the emitter and base terminals of PNP transistor 113 are both equal in potential to negative power supply 107 (i.e., −Vs). In that case, if the potential of the collector terminal of PNP transistor 113 is decreased to be lower than the potential of the input nodes of interruption circuit 116 and emergency stop circuit 117, PNP transistor 113 will be in a reverse bias state and may be destroyed. Accordingly, in order to prevent this, a diode 118 is provided between the collector terminal of PNP transistor 113 and the input nodes of interruption circuit 116 and emergency stop circuit 117.

However, the short circuit protection circuit of FIG. 1 has a problem, that is, a delayed protective operation. This is because, as described above, when semiconductor switching element 109 is in the OFF state, operation monitoring circuit 111 has its overall potential decreased to the potential of negative power supply 107, i.e., −Vs. A short circuit failure occurs when semiconductor switching element 109 is in the on state, and generally, a short circuit starts from a point in time of turn-on, that is, when semiconductor switching element 109 shifts from the off state to the on state. In the short circuit protection circuit of FIG. 1, at a moment when semiconductor switching element 109 turns on, although the emitter terminal of PNP transistor 113 of operation monitoring circuit 111 is connected to positive power supply 106, the potential of the remainder of operation monitoring circuit 111 does not immediately rise due to parasitic capacitance. For this reason, it takes time before operation monitoring circuit 111 shifts to a normal operational state, and as a result, the protective operation by the short circuit protection circuit is delayed. In other words, this problem is caused by the fact that the potential of each part of operation monitoring circuit 111 varies with an in-phase component of the potentials at the opposite ends of gate resistor 112.

In a first embodiment described hereinafter, a configuration of a short circuit protection circuit capable of avoiding the problem in Comparative Example 1 will be described.

Comparative Example 2

FIG. 2 is a circuit diagram showing a configuration of a short circuit protection circuit for a semiconductor switching element as Comparative Example 2. This circuit corresponds to FIG. 10 of PTL 1.

The circuit of FIG. 2 differs from that of FIG. 1 in that, in place of gate resistor 112 of FIG. 1, the former includes a gate resistor 104 connected between the drain terminal of transistor 102 and positive power supply 106, and a gate resistor 105 connected between the drain terminal of transistor 103 and negative power supply 107. Further, the circuit of FIG. 2 differs from the circuit of FIG. 1 in that PNP transistor 113 constituting operation monitoring circuit 111 has the base and emitter terminals connected to the opposite end terminals, respectively, of gate resistor 104.

In the case of the circuit of FIG. 2, regardless of whether semiconductor switching element 109 is on or off, that is, regardless of whether transistors 102 and 103 are on or off, the potential of each part of operation monitoring circuit 111 is substantially equal to the potential of positive power supply 106, or +Vs. Therefore, such a delay of the protective operation that occurs for the circuit of FIG. 1 does not occur for the circuit of FIG. 2. However, when a plurality of semiconductor switching elements 109 are connected in parallel to increase power that can be controlled, the short circuit protection circuit of FIG. 2 provides a delayed protective operation. Hereinafter, a further description will be provided with reference to FIG. 3.

FIG. 3 is a circuit diagram showing a configuration in which semiconductor switching elements are arranged in parallel in FIG. 2. In FIG. 3, a semiconductor switching element 109B is disposed parallel to semiconductor switching element 109. Semiconductor switching element 109B has a gate terminal 140B coupled to gate terminal 140 of semiconductor switching element 109. Thereby, semiconductor switching element 109 and semiconductor switching element 109B are simultaneously driven by gate driver 127.

For semiconductor switching element 109B, a second RTC circuit 110B having the same configuration as a first RTC circuit 110 is provided. Second RTC circuit 110B operates to mandatorily lower the gate voltage of semiconductor switching element 109B when semiconductor switching element 109B is in a short-circuit state.

For the parallel drive circuit of FIG. 3, in order to make a speed to drive semiconductor switching elements 109 and 109B for a normal operation equal to a speed to drive semiconductor switching element 109 in the case of the single driving in FIG. 2, a current passing through gate resistor 104 must be doubled. This is because the gate current passing through the gate terminal of each of semiconductor switching elements 109 and 109B in FIG. 3 must be the same as in the case of FIG. 2. For this reason, gate resistors 104 and 105 each need to have a resistance value which is half that in the case of FIG. 2. In the case of FIG. 3, resistive elements having the same resistance value as in the case of FIG. 2 are disposed in parallel so that gate resistors 104 and 105 each have a resistance value which is half that in the case of FIG. 2.

However, halving the resistance value of gate resistor 104, as shown in FIG. 3, delays detecting that RTC circuits 110 and 110B operate, and may be a cause of a delayed short circuit protective operation. Hereinafter, a specific description will be given with reference to FIG. 3.

First, a short circuit occurs in semiconductor switching element 109 and semiconductor switching element 109B simultaneously while they are driven for the sake of illustration. Such a simultaneous-short-circuiting state occurs for example in a case in which as drive signal DS is erroneously set, drive signal DS in the on state is issued when it should not be turned on.

For such a simultaneous-short-circuiting state, RTC circuits 110 and 110B operate simultaneously. Then, an ability to lower the potential of gate wiring 108 is doubled as compared with that in the case of FIG. 2. Accordingly, the current passing through gate resistor 104 is also doubled as compared with that in the case of FIG. 2. Therefore, even if the resistance value of gate resistor 104 in FIG. 3 is only half that in FIG. 2, the voltage generated in gate resistor 104 in FIG. 3 is the same as that in FIG. 2. As a result, operation monitoring circuit 111 detects that RTC circuits 110 and 110B operate at the same speed as that in the case of FIG. 2, and the short circuit protective operation is performed without delay.

It is another story, however, when a short circuit occurs in only one of semiconductor switching elements 109 and 109B. For example, let us consider a case where a short circuit occurs in only semiconductor switching element 109 and no short circuit occurs in semiconductor switching element 109B. Such an unbalanced short circuit may occur by overheating of the element.

When a short circuit occurs in only semiconductor switching element 109, RTC circuit 110 operates whereas RTC circuit 110B does not. This means that the ability to lower the potential of gate wiring 108 is only the same as in the case of FIG. 2. As gate resistor 104 in FIG. 3 is half in magnitude that of gate resistor 102 in FIG. 2, a voltage generated in gate resistor 104 will be half that in FIG. 2. As a result, operation monitoring circuit 111 operates with a delay, and interruption circuit 116 and emergency stop circuit 117 will also operate with a delay. Such a delayed short circuit protective operation may cause destruction of semiconductor switching element 109, which is a serious problem.

In a second embodiment described hereinafter, a configuration of a short circuit protection circuit capable of avoiding the problem in Comparative Example 2 as described above will be described.

First Embodiment

[General Configuration of Semiconductor System Including Short Circuit Protection Circuit]

Figure 4:
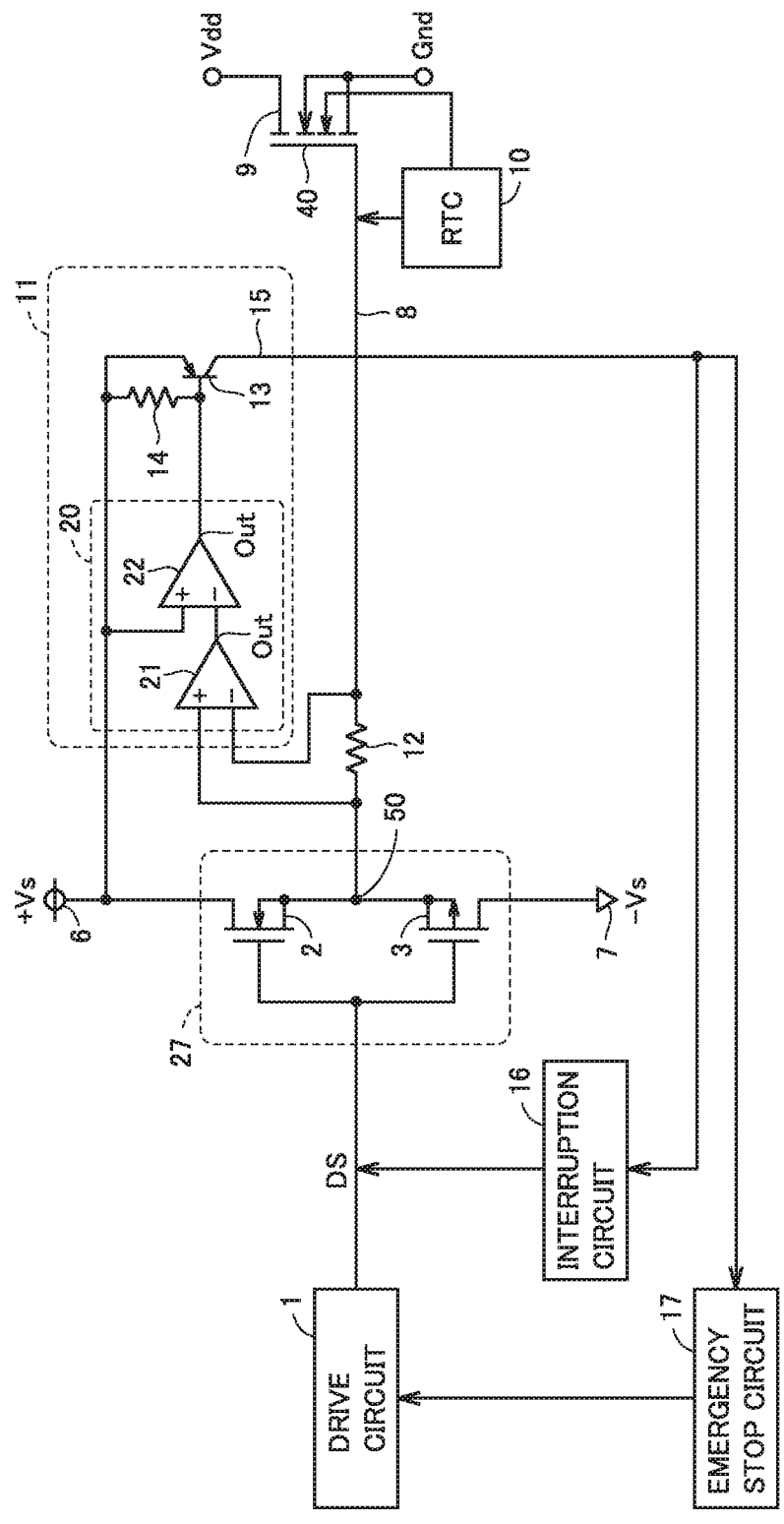
FIG. 4 is a circuit diagram showing a configuration of a semiconductor system to which a short circuit protection circuit according to a first embodiment is applied.

FIG. 4 is a circuit diagram showing a configuration of a semiconductor system to which a short circuit protection circuit according to a first embodiment is applied.

Referring to FIG. 4, the short circuit protection circuit protects semiconductor switching element 9. The short circuit protection circuit includes a real-time control (RTC) circuit 10, an operation monitoring circuit 11, an interruption circuit 16, an emergency stop circuit 17, and a gate resistor 12.

Semiconductor switching element 9 is a self turn-off semiconductor switching element and is driven as controlled by a drive circuit 1. Semiconductor switching element 9 is not particularly limited in type. For example, semiconductor switching element 9 may be an N-channel MOSFET shown in the figure, an IGBT (Insulated Gate Bipolar Transistor), or a bipolar transistor.

Drive circuit 1 outputs drive signal DS which is in turn input to a gate driver 27 which in turn drives semiconductor switching element 9. Gate driver 27 has gate output transistors 2 and 3. Transistor 2 is an N-channel MOSFET, and its drain terminal is connected to a positive power supply 6. Transistor 3 is a P-channel MOSFET, and its drain terminal is connected to a negative power supply 7.

Note that transistors 2 and 3 constituting gate driver 27 are not limited in channel polarity to those shown in FIG. 4, and they may both be N-channel MOSFETs, for example. In that case, drive signal DS input to the gate terminal of one transistor is an inverted version in logic level of drive signal DS input to the gate terminal of the other transistor. Transistors 2 and 3 are not limited in type to MOSFET. For example, a bipolar transistor may be used instead of a MOSFET.

The source terminal of transistor 2 and the source terminal of transistor 3 are coupled to each other via a connection node (hereinafter referred to as an output node 50 of gate driver 27). Output node 50 is connected to a gate terminal 40 of semiconductor switching element 9 via a gate wiring 8. Gate wiring 8 is provided with a gate resistor 12.

Semiconductor switching element 9 has a sense cell incorporated therein. RTC circuit 10 is connected with the sense cell. RTC circuit 10 determines the magnitude of a current passing through the sense cell, and when RTC circuit 10 determines that the current is an overcurrent, RTC circuit 10 operates to lower the gate voltage of semiconductor switching element 9.

Figure 5:
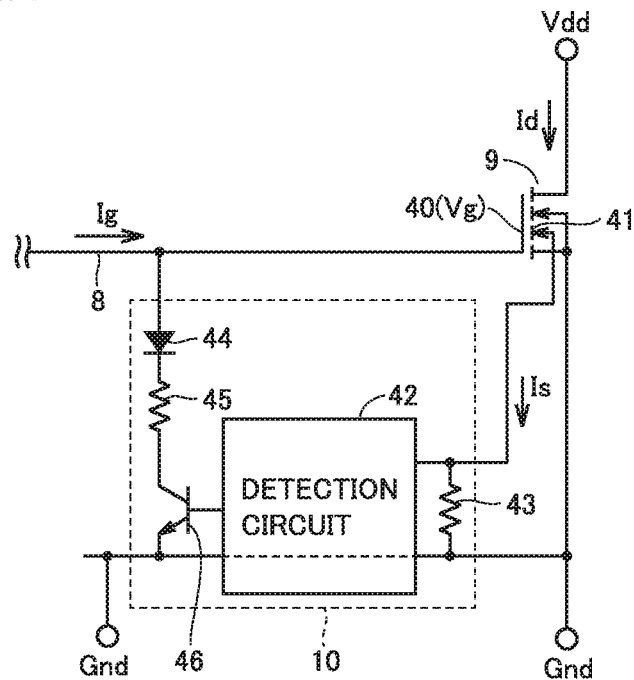
FIG. 5 is a circuit diagram showing an example of an RTC circuit of FIG. 4.

FIG. 5 is a circuit diagram showing an example of the RTC circuit of FIG. 4. Referring to FIG. 5, RTC circuit 10 includes resistive elements 43 and 45, a detection circuit 42 that detects a short-circuit current, a diode 44, and a transistor 46.

Resistive element 43 is connected between a sense cell 41 of semiconductor switching element 9 and a node which provides a reference potential Gnd. Resistive element 43 is used as a current sense resistor for sensing a sense current Is.

Diode 44, resistive element 45, and transistor 46 are connected in series between gate wiring 8 and the node that provides reference potential Gnd so that diode 44's polarity is in the forward direction with diode 44, resistive element 45 and transistor 46 arranged in the stated order. Transistor 46 may be a MOSFET or a bipolar transistor for example. FIG. 4 illustrates a case where transistor 46 is an NPN bipolar transistor. Transistor 46 has a control electrode (a gate or a base) connected to detection circuit 42.

Detection circuit 42 detects a voltage across resistive element 43 and determines whether the detected voltage exceeds a threshold value. Detection circuit 42 switches transistor 46 from the off state to the on state when the voltage of resistive element 43 exceeds the threshold value. This allows a gate current Ig to flow through diode 44, resistive element 45, and transistor 46.

Note that semiconductor switching element 9 has gate terminal 40 connected to positive power supply 6 via transistor 2 in the on state. Therefore, even though RTC circuit 10 can limit a short-circuit current passing through semiconductor switching element 9 by urgently lowering the potential of gate terminal 40 of semiconductor switching element 9, RTC circuit 10 cannot completely turn off semiconductor switching element 9.

Referring to FIG. 4 again, operation monitoring circuit 11 monitors a gate current that passes through gate resistor 12 to detect that RTC circuit 10 operates. Specifically, operation monitoring circuit 11 detects a potential difference across gate resistor 12 when semiconductor switching element 9 is on.

As shown in FIG. 4, operation monitoring circuit 11 includes a differential voltage circuit 20 and a PNP-type bipolar transistor (PNP transistor) 13.

Differential voltage circuit 20 extracts a potential difference across gate resistor 12 and outputs it. In other words, of the potentials at the opposite ends of gate resistor 12, an in-phase component is removed therefrom and a differential component is alone extracted therefrom. The absolute value of the differential component extracted by differential voltage circuit 20 is output between the emitter and base terminals of PNP transistor 13. PNP transistor 13 has the emitter terminal connected to positive power supply 6, and, eventually, differential voltage circuit 20 outputs a potential difference between a potential proportional to the potential difference across gate resistor 12 and the potential of positive power supply 6, or a voltage proportional to that potential difference, between the emitter and base terminals of PNP transistor 13.

Operation monitoring circuit 11 is further provided with a resistive element 14. Resistive element 14 is connected between the base and emitter terminals of PNP transistor 13. PNP transistor 13 has a collector terminal connected to interruption circuit 16 and emergency stop circuit 17.

According to the circuit configuration of operation monitoring circuit 11 described above, resistive element 14 pulls up the base potential to the emitter potential (that is, the potential of positive power supply 6, or +Vs), and accordingly, PNP transistor 13 is normally in the OFF state. When a short circuit occurs in semiconductor switching element 9 and RTC circuit 10 operates, the gate potential of semiconductor switching element 9 is mandatorily lowered, and accordingly, the gate current increases. This increased gate current increases a potential difference across gate resistor 12. Thereby, differential voltage circuit 20 outputs an increased voltage, and accordingly, a potential difference between the base and emitter of PNP transistor 13 is also increased, and, as a result, PNP transistor 13 is turned on. Once PNP transistor 13 is turned on, potential Vs of positive power supply 6 is input to interruption circuit 16 and emergency stop circuit 17 via collector terminal 15 of PNP transistor 13.

As has been described above, the emitter terminal of PNP transistor 13 is connected to positive power supply 6 and is not connected to one end of gate resistor 12. In this respect, operation monitoring circuit 11 of FIG. 4 is different from operation monitoring circuit 111 of FIG. 1. Therefore, in contrast to the case of FIG. 1, even when semiconductor switching element 9 is in the off state, operation monitoring circuit 11 never has its overall potential dropping to the potential of negative power supply 7, or –Vs. For this reason, when semiconductor switching element 9 is turned on and off, operation monitoring circuit 11 does not cause charging/discharging of parasitic capacitance, and its operation is never delayed. Further, since operation monitoring circuit 11 does not vary in potential, it is unnecessary to provide diode 118 as shown in FIG. 1 on the side of the collector terminal of PNP transistor 13.

Interruption circuit 16 interrupts drive signal DS when interruption circuit 16 receives a signal of a positive voltage +Vs from operation monitoring circuit 11. For example, interruption circuit 16 fixes the potential of a wiring connecting an output node of drive circuit 1 and an input node of gate driver 27 to the potential of negative power supply 7, or –Vs.

Emergency stop circuit 17 controls drive circuit 1 so that drive signal DS has a logical level fixed to a low level (an L level) when emergency stop circuit 17 receives a signal of positive voltage +Vs from operation monitoring circuit 11.

[Configuration of Differential Voltage Circuit]

Hereinafter, a configuration of differential voltage circuit 20 will be described in more detail. As shown in FIG. 4, differential voltage circuit 20 includes a first differential amplifier 21 and a second differential amplifier 22. Differential amplifiers 21 and 22 each have two input terminals that are a positive input terminal and a negative input terminal, and output from an output terminal Out a potential difference between the terminals as an absolute value.

Differential amplifier 21 has the positive input terminal (also referred to as a high-potential input terminal VinH) connected to a connection node between gate resistor 12 and gate driver 27. Differential amplifier 21 has the negative input terminal (also referred to as a low-potential input terminal VinL) connected to a connection node between gate resistor 12 and gate terminal 40 of semiconductor switching element 9. Differential amplifier 21 has output terminal Out connected to the negative input terminal of differential amplifier 22. Differential amplifier 22 has the positive input terminal connected to positive power supply 6. Differential amplifier 22 has output terminal Out connected to the base terminal of PNP transistor 13.

Figure 6:
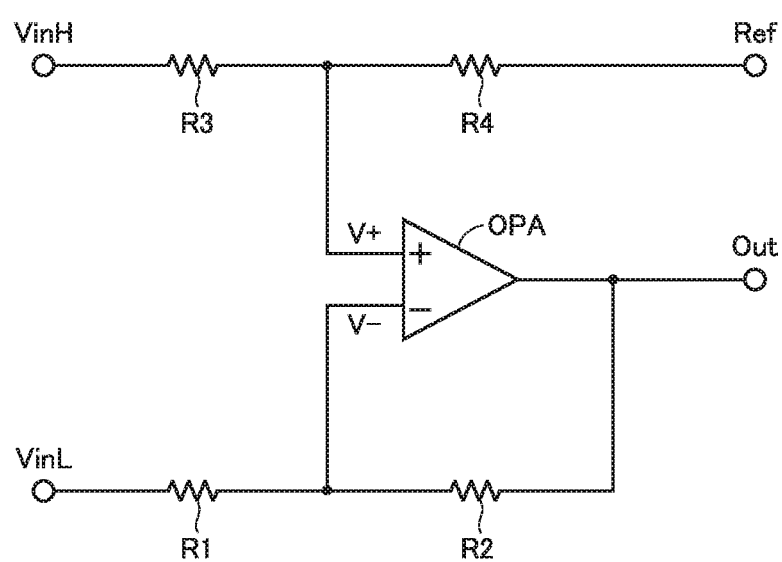
FIG. 6 is a circuit diagram showing an example of a detailed configuration of a differential amplifier of FIG. 4.

FIG. 6 is a circuit diagram showing an example of a detailed configuration of the differential amplifier of FIG. 4. As shown in FIG. 5, differential amplifiers 21 and 22 of FIG. 4 can each be configured using an operational amplifier OPA and resistive elements R1, R2, R3 and R4.

As shown in FIG. 6, operational amplifier OPA has a positive input terminal connected to high-potential input terminal VinH via resistive element R3 and connected to a reference terminal Ref via resistive element R4. Operational amplifier OPA has a negative input terminal connected to low-potential input terminal VinL via resistive element R1 and connected to an output terminal of operational amplifier OPA via resistive element R2. Operational amplifier OPA has an output terminal connected to output terminal Out of the differential amplifier.

Herein, resistive elements R1, R2, R3 and R4 have resistance values R1, R2, R3 and R4, respectively, and R1=R3 and R2=R4 for the sake of illustration. Further, high-potential input terminal VinH, low-potential input terminal VinL, output terminal Out, and reference terminal Ref have potentials VinH, VinL, Out, and Ref, respectively, for the sake of illustration. Then, $$\text{Out}=(VinH-VinL)\times R2/R1+\text{Ref} \qquad (1)$$

is established. In particular, if R1=R2=R3=R4, output terminal Out of the differential amplifier will have a potential equal to the potential of high-potential input terminal VinH minus the potential of low-potential input terminal VinL plus the potential of reference terminal Ref

[Operation of Operation Monitoring Circuit]

Hereinafter, how operation monitoring circuit 11 operates will be described.

Figure 7:
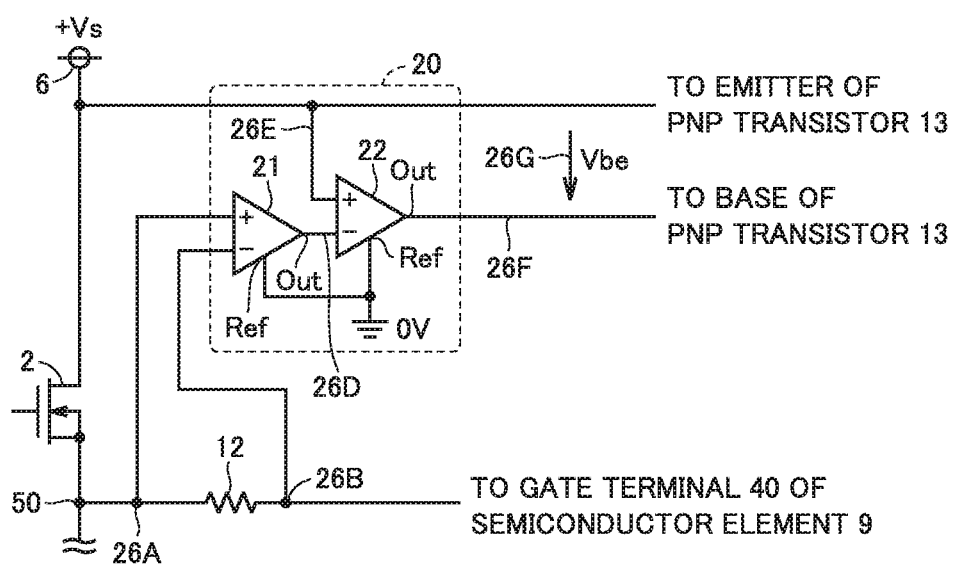
FIG. 7 is a circuit diagram showing the differential voltage circuit of FIG. 4 and its periphery.

FIG. 7 is a circuit diagram showing the differential voltage circuit of FIG. 4 and its periphery. In FIG. 7, a reference character is assigned to each portion on the input and output sides of differential amplifiers 21 and 22 constituting differential voltage circuit 20.

Figure 8:
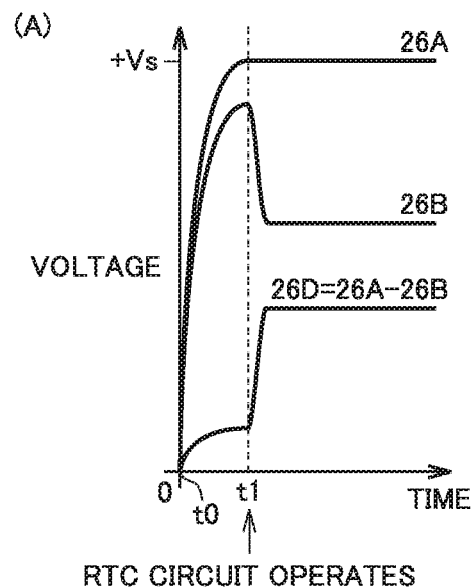
FIG. 8 represents a voltage waveform in each part of FIG. 7.
Figure 8:
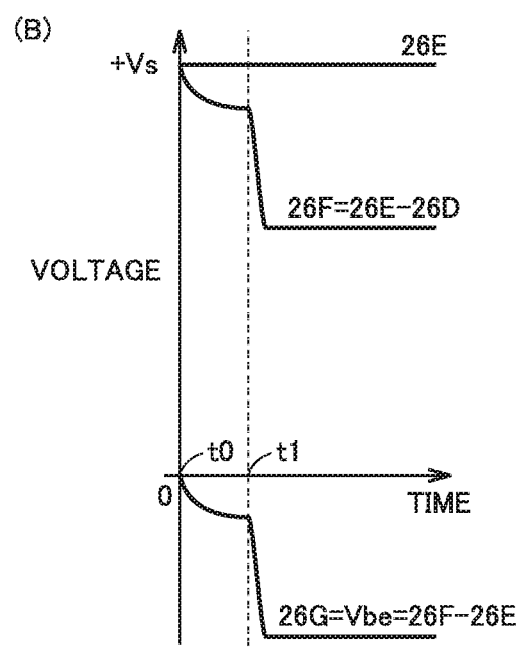

FIG. 8 represents a voltage waveform in each part of FIG. 7. Specifically, FIG. 8(A) shows a graph representing a positive input potential 26A of differential amplifier 21, a negative input potential 26B of differential amplifier 21, and an output potential 26D of differential amplifier 21. Positive input potential 26A of differential amplifier 21 is equal to the potential of output node 50 of gate driver 27. Negative input potential 26B of differential amplifier 21 is equal to the gate potential of semiconductor switching element 9.

FIG. 8(B) shows a graph representing a positive input potential 26E of differential amplifier 22, an output potential 26F of differential amplifier 22, and a potential difference 26G between the gate and emitter of PNP transistor 13. Positive input potential 26E of differential amplifier 22 is equal to the potential of positive power supply 6, or +Vs.

With reference to FIGS. 7 and 8, transistor 2 turns on at time t0 in FIG. 8. When a short circuit occurs in semiconductor switching element 9, RTC circuit 10 operates at time t1, and the gate potential of semiconductor switching element 9, that is, negative input potential 26B of differential amplifier 21, is mandatorily lowered by RTC circuit 10. Positive input potential 26A of differential amplifier 21 minus negative input potential 26B of differential amplifier 21 provides a difference in voltage equal to output potential 26D of differential amplifier 21 (note that differential amplifier 21 has an amplification factor set to 1).

Output potential 26D of differential amplifier 21 is input to low-potential input terminal VinL of differential amplifier 22. The potential of positive power supply 6, or +Vs, that is, positive input potential 26E of differential amplifier 22 minus output potential 26D of differential amplifier 21 provides a difference in voltage equal to output potential 26F of differential amplifier 22 (note that differential amplifier 22 has an amplification factor set to 1).

Therefore, the base-emitter voltage of PNP transistor 13, or potential difference 26G, is output potential 26F of differential amplifier 22 minus potential Vs (equal to 26E) of positive power supply 6. This potential difference 26G is pulled negatively when RTC circuit 10 operates, and PNP transistor 13 turns on. Thereby, the protective operation by interruption circuit 16 and emergency stop circuit 17 of FIG. 4 is performed. This protective operation is performed without delay because there is no charging/discharging of parasitic capacitance of operation monitoring circuit 11.

In addition, the configuration of differential voltage circuit 20 in FIG. 7 is devised so that reference terminal Ref of each of differential amplifiers 21 and 22 has a potential of 0 V, and ensures high-precision operation of voltage output.

[Other Example Configuration of Differential Voltage Circuit]

When there is a margin for protection speed and the potential of reference terminal Ref of differential amplifier 21 can be set to high voltage, differential voltage circuit 20 can be constituted of a single differential amplifier.

Figure 9:
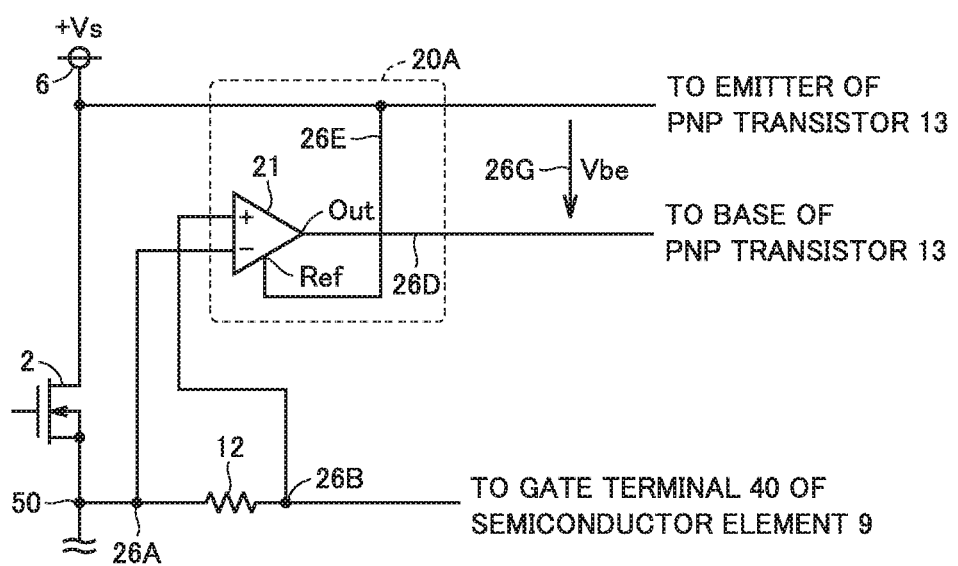
FIG. 9 is a circuit diagram showing a configuration of a modification of the differential voltage circuit of FIG. 7.

FIG. 9 is a circuit diagram showing a configuration of a modification of the differential voltage circuit of FIG. 7. FIG. 9 shows a differential voltage circuit 20A, which is different from differential voltage circuit 20 of FIG. 7 in that the former only includes differential amplifier 21 and does not include differential amplifier 22.

Further, differential voltage circuit 20A of FIG. 9 is different from differential voltage circuit 20 of FIG. 7 in how differential amplifier 21 has its positive input terminal, negative input terminal and reference terminal Ref connected. Specifically, for differential voltage circuit 20A of FIG. 9, differential amplifier 21 has the positive input terminal connected to a connection node between gate resistor 12 and gate terminal 40 of semiconductor switching element 9. Differential amplifier 21 has the negative input terminal connected to a connection node between gate resistor 12 and gate driver 27. These connection relationships are opposite to those in FIG. 7. Further, differential amplifier 21 has reference terminal Ref connected to positive power supply 6.

With the above configuration, output terminal Out of differential amplifier 21 can be connected to the gate of PNP transistor 13, and differential amplifier 22 can be dispensed with and the cost of differential amplifier 22 can be reduced. The remainder of FIG. 9 is the same as FIG. 7, and accordingly, identical or equivalent components are identically denoted and will not be described redundantly. Hereinafter, how differential voltage circuit 20A shown in FIG. 9 operates will be described.

Figure 10:
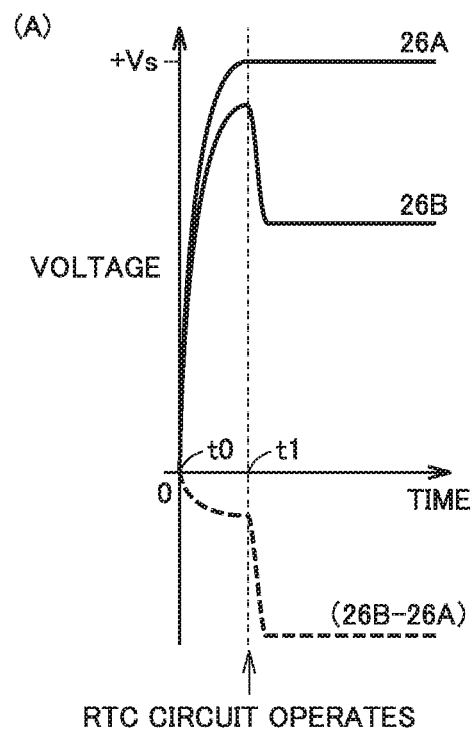
FIG. 10 represents a voltage waveform in each part of FIG. 9.
Figure 10:
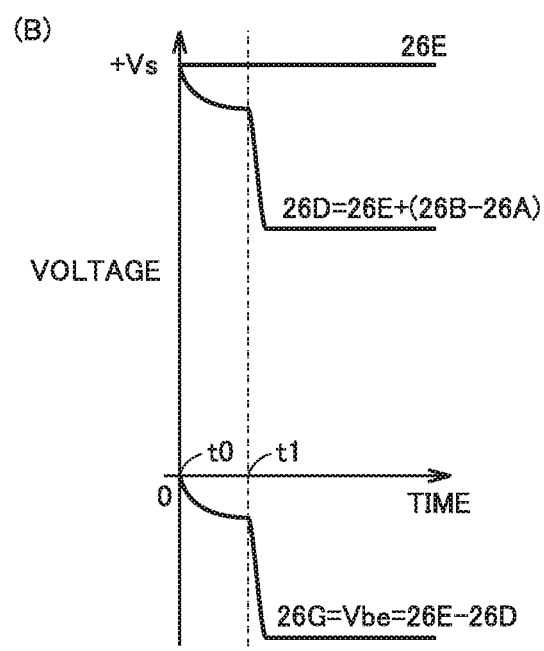

FIG. 10 represents a voltage waveform in each part of FIG. 9. Specifically, FIG. 10(A) shows a graph representing positive input potential 26B of differential amplifier 21, negative input potential 26A of differential amplifier 21, and their potential difference (i.e., 26B minus 26A). Negative input potential 26A of differential amplifier 21 is equal to the potential of output node 50 of gate driver 27. Positive input potential 26B of differential amplifier 21 is equal to the gate potential of semiconductor switching element 9.

FIG. 10(B) shows a graph representing output potential 26D of differential amplifier 21, and potential difference 26G between the gate and emitter of PNP transistor 13.

With reference to FIGS. 9 and 10, transistor 2 turns on at time t0 in FIG. 10. When a short circuit occurs in semiconductor switching element 9, RTC circuit 10 operates at time t1, and the gate potential of semiconductor switching element 9, that is, positive input potential 26B of differential amplifier 21, is mandatorily lowered by RTC circuit 10. A difference in voltage of positive input potential 26B of differential amplifier 21 minus negative input potential 26A of differential amplifier 21 (as indicated in FIG. 10(A) by a broken line) plus the potential of reference terminal Ref of differential amplifier 21, or +Vs, is output as output potential 26D of differential amplifier 21 (note that differential amplifier 21 has an amplification factor set to 1).

Therefore, the base-emitter voltage of PNP transistor 13, or potential difference 26G, is output potential 26D of differential amplifier 21 minus potential Vs (equal to 26E) of positive power supply 6. This potential difference 26G is pulled negatively when RTC circuit 10 operates, and PNP transistor 13 turns on. Thereby, the protective operation by interruption circuit 16 and emergency stop circuit 17 of FIG. 4 is performed.

[Effect]

Thus, according to the short circuit protection circuit of the first embodiment, in contrast to comparative example 1, operation monitoring circuit 11 is not charged/discharged when semiconductor switching element 9 is turned on/off, and a faster protective operation can be achieved than in comparative example 1. Furthermore, as will be described in the following second embodiment, the configuration of the short circuit protection circuit of the first embodiment is also applicable when semiconductor switching elements 9 are disposed in parallel.

If a countermeasure against noise is taken, then, in place of PNP transistor 13, for example, a comparator for comparing the output of differential amplifier 21 with a reference voltage may be provided to operation monitoring circuit 11, and this comparator's output may be transmitted to interruption circuit 16 and emergency stop circuit 17.

Second Embodiment

A second embodiment handles a case where a plurality of semiconductor switching elements are connected in parallel in order to increase power to be controlled. As has been described in comparative example 2, reducing a gate resistance so as not to reduce a speed of driving semiconductor switching elements connected in parallel causes a delay in detecting a short circuit of the semiconductor switching elements. In order to avoid this problem, in the second embodiment, in contrast to the case of FIG. 3, a gate resistor is provided between gate driver 27 and each semiconductor switching element. As such, the second embodiment is an extension of the first embodiment.

Hereinafter will be described mainly what is different from the first embodiment. Any portion shared with the first embodiment is identically denoted and no description may be provided therefor.

[General Configuration of Semiconductor System Including Short Circuit Protection Circuit]

Figure 11:
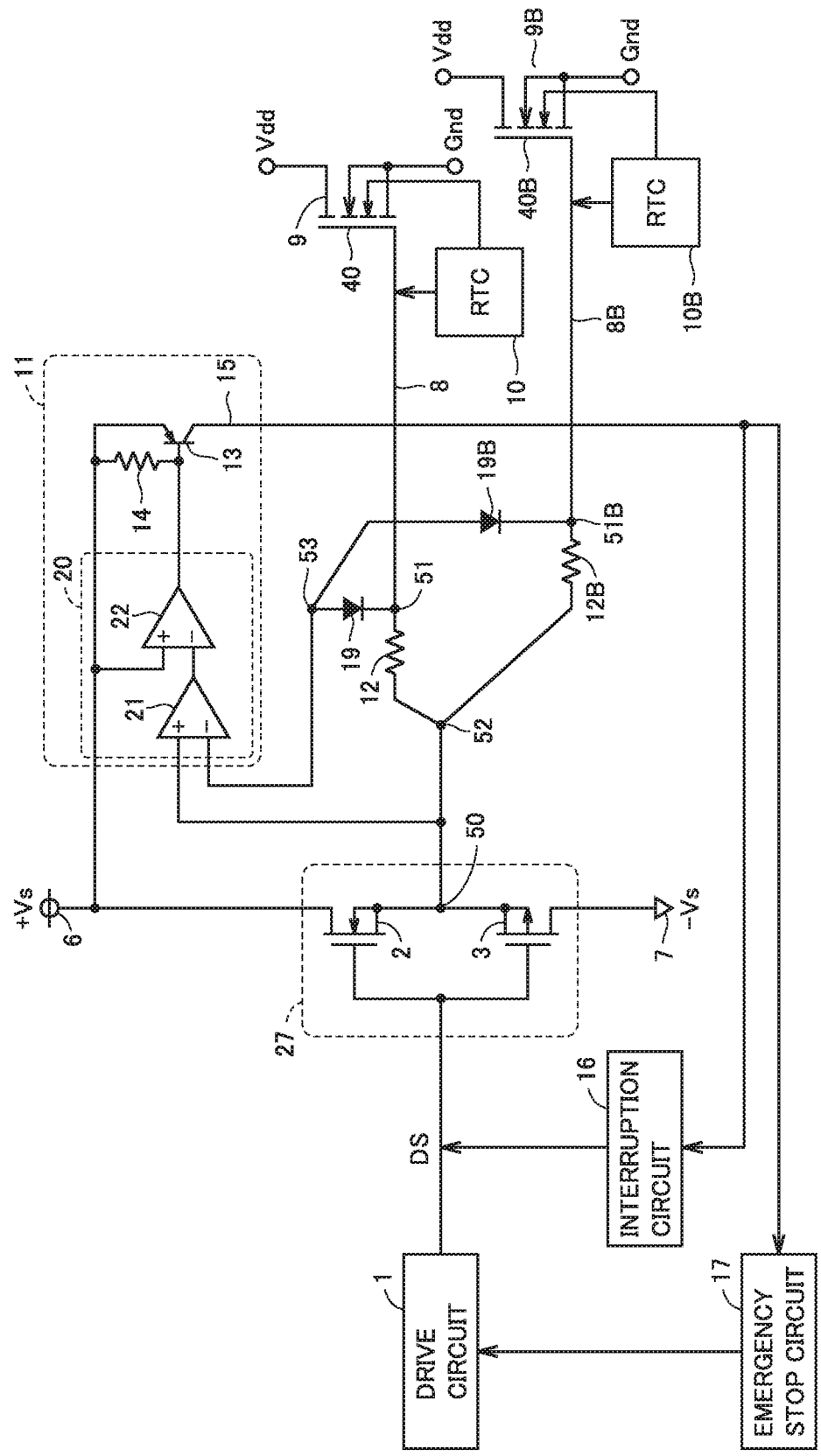
FIG. 11 is a circuit diagram showing a configuration of a semiconductor system to which a short circuit protection circuit according to a second embodiment is applied.

FIG. 11 is a circuit diagram showing a configuration of a semiconductor system to which a short circuit protection circuit according to the second embodiment is applied. While in FIG. 11, for the sake of simplicity, a case of two semiconductor switching elements 9 and 9B connected in parallel will be handled, a case where more semiconductor switching elements are connected in parallel can also be handled in the same manner.

As well as in the case of the first embodiment, semiconductor switching elements 9 and 9B are self turn-off semiconductor switching elements, and are driven as controlled by a common drive circuit 1. Drive circuit 1 outputs drive signal DS which is input to a common gate driver 27. Therefore, semiconductor switching elements 9 and 9B are driven simultaneously by receiving a common drive voltage (that is, the potential of positive power supply 6, or +Vs, and the potential of negative power supply 7, or −Vs) from gate driver 27. A specific example configuration of gate driver 27 is the same as in FIG. 4, and accordingly, will not be described redundantly.

Gate resistor 12 is connected between output node 50 of gate driver 27 and gate terminal 40 of semiconductor switching element 9, and a gate resistor 12B is connected between output node 50 of gate driver 27 and a gate terminal 40B of semiconductor switching element 9B. That is, a gate wiring extending from output node 50 of gate driver 27 branches at a branch point 52, and gate resistor 12 is provided to gate wiring 8 for semiconductor switching element 9 and gate resistor 12B is provided to gate wiring 8B for semiconductor switching element 9B. Thus, gate resistors 12 and 12B are provided for semiconductor switching elements 9 and 9B, respectively.

The short circuit protection circuit includes RTC circuit 10 for semiconductor switching element 9, an RTC circuit 10B for semiconductor switching element 9B, operation monitoring circuit 11, interruption circuit 16, emergency stop circuit 17, gate resistors 12 and 12B as described above, and diodes 19 and 19B. Operation monitoring circuit 11, interruption circuit 16, and emergency stop circuit 17 are shared by semiconductor switching elements 9 and 9B.

RTC circuit 10 is connected to the sense cell of semiconductor switching element 9 and determines the magnitude of a current passing through the sense cell, and when RTC circuit 10 determines that the current is an overcurrent, RTC circuit 10 operates to lower the gate voltage of semiconductor switching element 9. Similarly, RTC circuit 10B is connected to a sense cell of semiconductor switching element 9B and determines the magnitude of a current passing through the sense cell, and when RTC circuit 10B determines that the current is an overcurrent, RTC circuit 10B operates to lower the gate voltage of semiconductor switching element 9B. An example configuration of RTC circuits 10 and 10B are the same as that in the first embodiment, and accordingly, will not be described redundantly.

Operation monitoring circuit 11 detects that RTC circuit 10 operates by monitoring a gate current passing through gate resistor 12, and also detects that RTC circuit 10B operates by monitoring a gate current passing through gate resistor 12B. Specifically, operation monitoring circuit 11 detects a voltage generated in gate resistor 12 when semiconductor switching element 9 is on, and operation monitoring circuit 11 detects a voltage generated in gate resistor 12B when semiconductor switching element 9B is on.

A specific example configuration of operation monitoring circuit 11 is the same as that in the first embodiment. As has been described in detail with reference to FIGS. 4 and 7, operation monitoring circuit 11 includes differential voltage circuit 20, PNP transistor 13, and resistive element 14. Further, differential voltage circuit 20 includes differential amplifiers 21 and 22.

How operation monitoring circuit 11 and gate resistors 12 and 12B are connected is different from the cases of FIGS. 4 and 7 of the first embodiment. In the case of FIG. 11, diodes 19 and 19B are provided so that operation monitoring circuit 11 can simultaneously monitor the voltages generated respectively in gate resistors 12 and 12B. Specifically, diode 19 has a cathode terminal connected to a connection node 51 between gate resistor 12 and gate terminal 40 of semiconductor switching element 9. Diode 19B has a cathode terminal connected to a connection node 51B between gate resistor 12B and gate terminal 40B of semiconductor switching element 9B. Diodes 19 and 19B have their respective anode terminals connected to the negative input terminal of differential amplifier 21 via a connection node 53 located on the side of the anodes. Differential amplifier 21 has the positive input terminal connected between output node 50 of gate driver 27 and branch point 52 of the gate wiring.

[Operation of Operation Monitoring Circuit]

The connection between operation monitoring circuit 11 and gate resistors 12 and 12B as described above allows detection of a short circuit in each of semiconductor switching elements 9 and 9B without operation monitoring circuit 11 and gate resistors 12 and 12B affecting each other.

For example, when a short circuit occurs in semiconductor switching element 9 and accordingly, RTC circuit 10 operates, the gate voltage of semiconductor switching element 9 decreases, and accordingly, a gate current passes through gate resistor 12. In that case, the potential of connection node 51 on the side of the cathode of diode 19 is lowered, and accordingly, the potential of connection node 53 on the side of the anode of diode 19 is also lowered. However, when no short circuit occurs in semiconductor switching element 9B, the potential of connection node 51B on the side of the cathode of diode 19B is higher than the potential of connection node 53 on the side of the anode thereof, and accordingly, a drop in potential of connection node 53 is blocked by diode 19B. Therefore, even if a short circuit occurs in semiconductor switching element 9 and accordingly, RTC circuit 10 operates, gate terminal 40B of semiconductor switching element 9B never has its potential lowered.

Further, operation speed at normal time and protection speed at time of failure in the FIG. 11 semiconductor system are the same as those in the first embodiment described with reference to FIG. 4. Herein, it is assumed that gate resistors 12 and 12B in FIG. 11 each have a resistance value equal to the resistance value of gate resistor 12 in FIG. 4. The FIG. 11 positive power supply 6 and negative power supply 7 have potential (+Vs) and potential (−Vs), respectively, equal in magnitude to those in the case of FIG. 4.

First, operation speed at normal time will be described. In FIG. 11, the current passing through gate resistors 12 and 12B when semiconductor switching elements 9 and 9B turn on is the same as the current passing through the single gate resistor 12 in FIG. 4. This is because the same potential of positive power supply 6 as that in FIG. 4 is applied to each of gate resistors 12 and 12B connected in parallel. Therefore, there is no difference in operation speed between the case where semiconductor switching elements 9 are connected in parallel as shown in FIG. 11 and the case where a single semiconductor switching element 9 is used as shown in FIG. 4.

Speed of detection of a short circuit by the short circuit protection circuit will now be described. Initially, when a short circuit occurs in one of semiconductor switching elements 9, e.g., when a short circuit occurs in only semiconductor switching element 9, only RTC circuit 10 operates. In that case, only gate terminal 40 of semiconductor switching element 9 has its potential lowered, and gate terminal 40B of semiconductor switching element 9B does not have its potential lowered. For this reason, an increased gate current passes only through gate resistor 12 and increases a potential difference across gate resistor 12. Thus, in the case of FIG. 11, a gate current generated as a single RTC circuit 10 lowers a gate voltage passes only through a single gate resistor 12, and a voltage generated in gate resistor 12 is the same as the case of FIG. 4 according to the first embodiment. Thus there is no difference between the ability of operation monitoring circuit 11 to detect a short circuit in FIG. 11 and that of the circuit to do so in FIG. 4, and a speed at which a semiconductor switching element is protected in FIG. 11 is the same as that at which the semiconductor switching element is protected in FIG. 4.

A case where a short circuit occurs in both semiconductor switching elements 9 and 9B simultaneously will be described. In that case, RTC circuits 10 and 10B both operate, and accordingly, RTC circuit 10 lowers the potential of gate terminal 40 of semiconductor switching element 9 and RTC circuit 10B lowers the potential of gate terminal 40B of semiconductor switching element 9B. This increases a potential difference across each of gate resistors 12 and 12B, and accordingly, a voltage generated in each of gate resistors 12 and 12B is the same as that in FIG. 4 according to the first embodiment. Thus there is no difference between the ability of operation monitoring circuit 11 to detect a short circuit in FIG. 11 and that of the circuit to do so in FIG. 4, and a speed at which the semiconductor switching elements are protected in FIG. 11 is the same as that at which the semiconductor switching element is protected in FIG. 4.

[Modification of Differential Voltage Circuit]

As has been described with reference to FIG. 9, differential voltage circuit 20A including only differential amplifier 21 may be provided instead of differential voltage circuit 20. Connection for this case will be described below.

Figure 12:
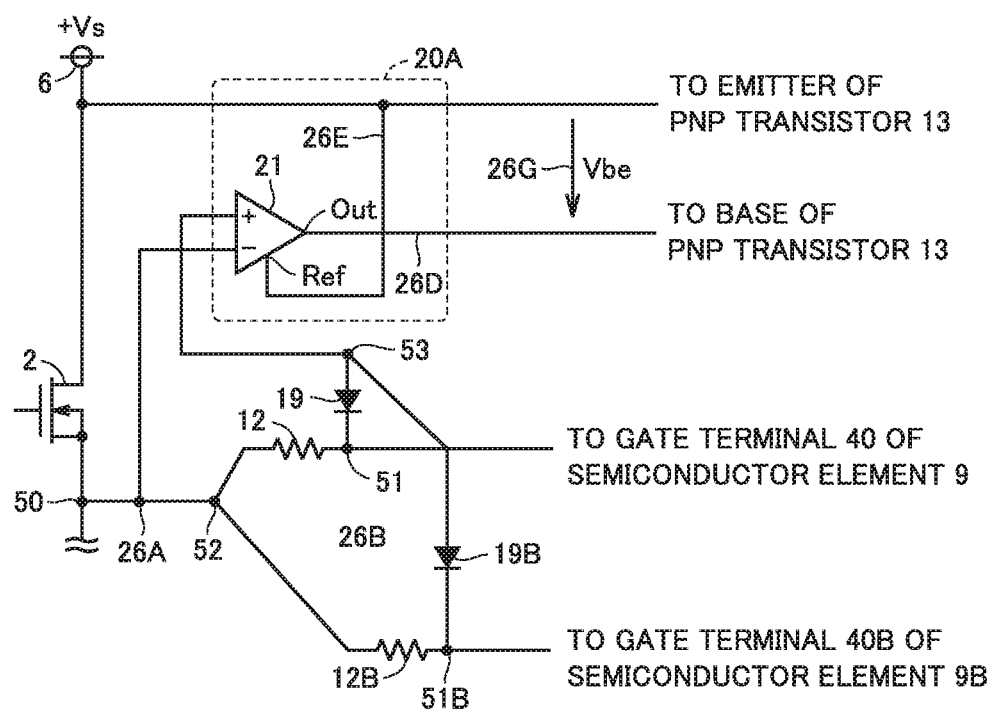
FIG. 12 is a circuit diagram showing a configuration of a modification of a differential voltage circuit of FIG. 11.

FIG. 12 is a circuit diagram showing a configuration of a modification of the differential voltage circuit of FIG. 11. Differential voltage circuit 20A of FIG. 12 is different from differential voltage circuit 20 of FIG. 11 in that the former includes only differential amplifier 21 and does not include differential amplifier 22.

Further, differential voltage circuit 20A of FIG. 12 is different from differential voltage circuit 20 of FIG. 11 in how differential amplifier 21 has its positive input terminal, negative input terminal and reference terminal Ref connected. Specifically, for differential voltage circuit 20A of FIG. 12, differential amplifier 21 has the positive input terminal connected to connection node 53 located on the side of the anodes of diodes 19 and 19B. Differential amplifier 21 has the negative input terminal connected between output node 50 of gate driver 27 and branch point 52 of the gate wiring. These connection relationships are opposite to those in FIG. 11. Further, differential amplifier 21 has reference terminal Ref connected to positive power supply 6.

With the above configuration, output terminal Out of differential amplifier 21 can be connected to the gate of PNP transistor 13, and differential amplifier 22 can be dispensed with and the cost of differential amplifier 22 can be eliminated. The remainder of FIG. 12 is the same as FIG. 11, and accordingly, identical or equivalent components are identically denoted and will not be described redundantly.

Further, how differential voltage circuit 20A of FIG. 12 operates is as has been described with reference to FIG. 10 except that a voltage generated in one of gate resistors 12 and 12B is input to the positive input terminal of differential amplifier 21. Accordingly, it will not be described in detail.

[Effect]

As described above, according to the semiconductor system including the short circuit protection circuit of the second embodiment, when a plurality of semiconductor switching elements are connected in parallel and driven, and a short circuit occurs in any of the elements, the element can be protected quickly without delay, whether the element may be some of the elements or all of the elements.

Third Embodiment

Figure 13:
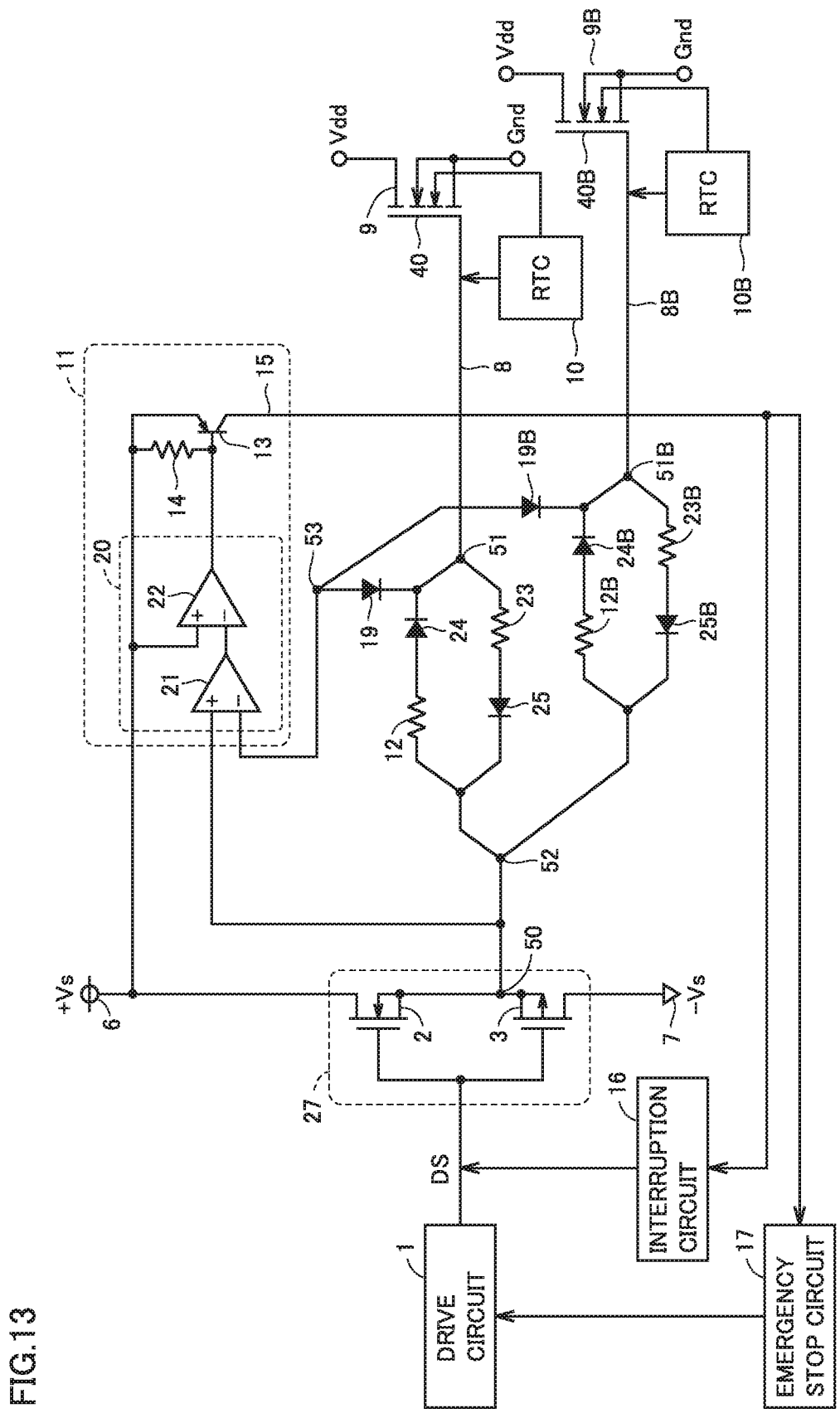
FIG. 13 is a circuit diagram showing a configuration of a semiconductor system comprising a short circuit protection circuit according to a third embodiment.

FIG. 13 is a circuit diagram showing a configuration of a semiconductor system comprising a short circuit protection circuit according to a third embodiment. The short circuit protection circuit according to the third embodiment is configured such that gate resistors 12 and 12B for semiconductor switching elements 9 and 9B have their respective resistance values varying between when the semiconductor switching elements turn on and when the semiconductor switching elements turn off. For this reason, the short circuit protection circuit of the third embodiment further includes gate resistors 23 and 23B in addition to gate resistors 12 and 12B.

Specifically, referring to FIG. 13, a turning-on gate resistor 12 and a turning-off gate resistor 23 are provided in parallel between output node 50 of gate driver 27 and gate terminal 40 of semiconductor switching element 9. A diode 24 is connected in series with gate resistor 12 such that gate terminal 40 of semiconductor switching element 9 is located on the side of the cathode thereof. A diode 25 is connected in series with gate resistor 23 such that gate terminal 40 of semiconductor switching element 9 is located on the side of the anode thereof.

Similarly, a turning-on gate resistor 12B and a turning-off gate resistor 23B are provided in parallel between output node 50 of gate driver 27 and gate terminal 40B of semiconductor switching element 9B. A diode 24B is connected in series with gate resistor 12B such that gate terminal 40B of semiconductor switching element 9B is located on the side of the cathode thereof. Furthermore, a diode 25B is connected in series with gate resistor 23B such that gate terminal 40B of semiconductor switching element 9B is located on the side of the anode thereof.

When the semiconductor switching elements turn on, diodes 25 and 25B interrupt a current, and accordingly, a current flows only through gate resistors 12 and 12B. When the semiconductor switching elements turn off, diodes 24 and 24B interrupt a current, and accordingly, a current flows only through gate resistors 23 and 23B.

With the above configuration, a speed to turn on semiconductor switching elements 9, 9B and that to turn off them when driving them can be individually controlled. That is, an optimum switching speed can be selected for turning on and turning off individually while adjusting a trade-off between a switching loss of the semiconductor switching elements and surge voltage. This allows a device to be reduced in size and achieve reduced power consumption.

The remainder of FIG. 13 is the same as FIG. 11, and accordingly, identical or equivalent components are identically denoted and will not be described redundantly. The circuit of the modification of differential voltage circuit 20 described with reference to FIG. 12 is also applicable to the case of FIG. 13.

Fourth Embodiment

A fourth embodiment also provides an example in which a gate resistor is changed in configuration. A short circuit protection circuit according to the fourth embodiment further includes a gate resistor 5 in addition to gate resistors 12 and 12B.

Figure 14:
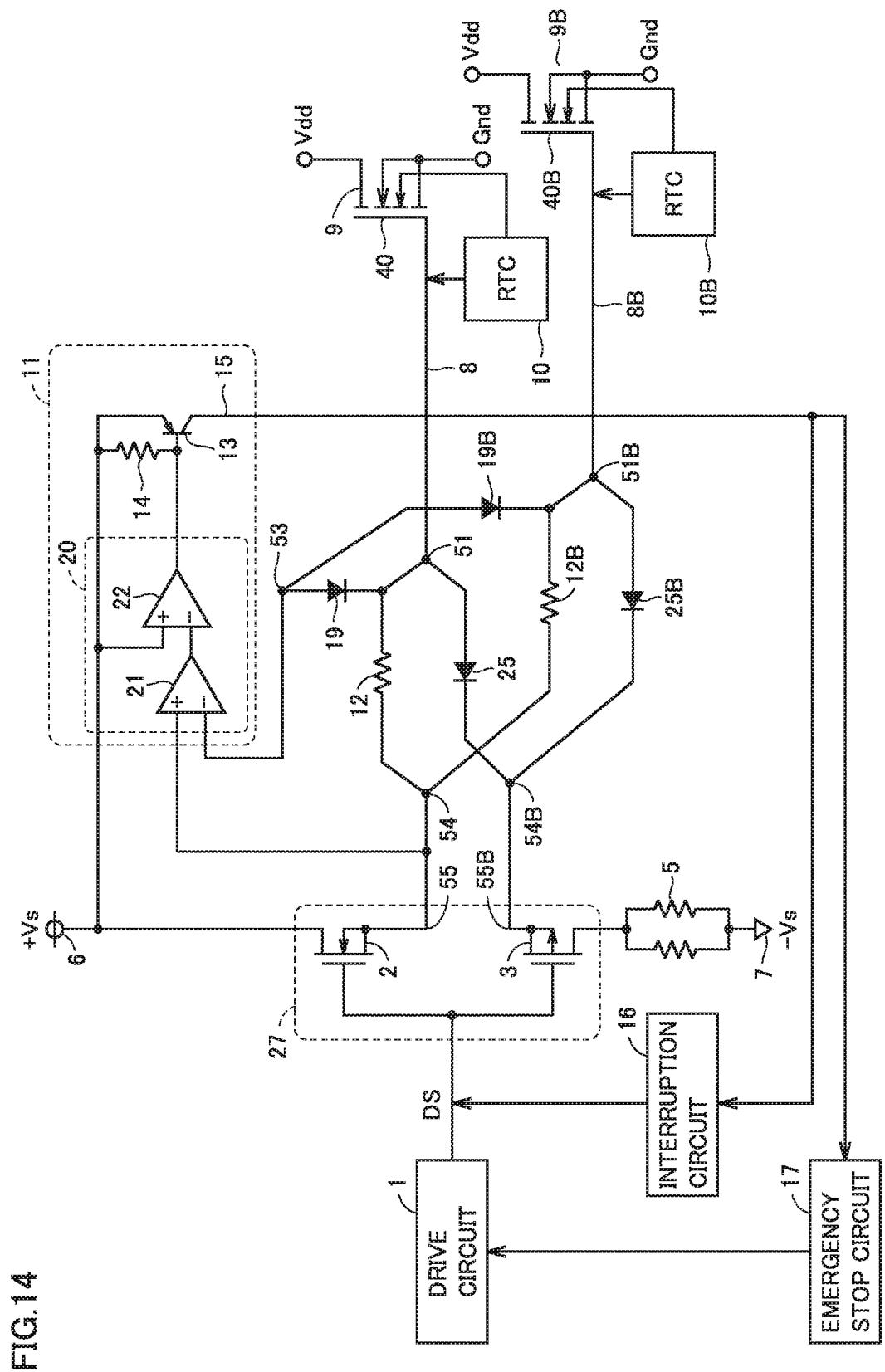
FIG. 14 is a circuit diagram showing a configuration of a semiconductor system comprising a short circuit protection circuit according to a fourth embodiment.

FIG. 14 is a circuit diagram showing a configuration of a semiconductor system comprising the short circuit protection circuit according to the fourth embodiment. Hereinafter, a feature of the semiconductor system of FIG. 14 will be described.

(i) The semiconductor system of FIG. 14 differs from the semiconductor systems of FIGS. 11 and 13 in that gate driver 27 has two output nodes 55 and 55B. Output node 55 is connected to positive power supply 6 via transistor 2. Output node 55B is connected to negative power supply 7 via transistor 3.

(ii) The semiconductor system of FIG. 14 differs from the semiconductor systems of FIGS. 11 and 13 in that turning-off gate resistor 5 is provided in series with transistor 3 and provided between output node 55B and negative power supply 7. Gate resistors 5 are provided in parallel depending on how many semiconductor switching elements 9 and 9B are disposed in parallel, and are configured to be reduced in magnitude. As a result, when semiconductor switching elements 9 and 9B turn off, the speed to turn off them is determined by the common gate resistor 5, which is advantageous in that it is not affected by variation in resistance value of gate resistors.

In the third embodiment shown in FIG. 13, in contrast, turning-off gate resistors 23 and 23B are provided to semiconductor switching elements 9 and 9B, respectively, and when the gate resistors have variation in magnitude depending on a manufacturing condition, the semiconductor switching elements would also be turned off at disadvantageously different speeds. Such variation and hence difference do not occur in the fourth embodiment shown in FIG. 14. This allows the elements to be turned off at a uniform speed, and can thus prevent an imbalance of currents, and hence a difference in temperature, destruction due to fatigue, and the like caused by the elements generating heat unevenly.

(iii) In the semiconductor system of FIG. 14, gate driver 27 has output node 55 (that is, the source terminal of transistor 2) connected to gate terminal 40 of semiconductor switching element 9 via turning-on gate resistor 12 and to gate terminal 40B of semiconductor switching element 9B via turning-on gate resistor 12B. This configuration can dispense with the diodes respectively connected in series to turning-on gate resistors 12 and 12B. This means that turning-on gate resistors 12 and 12B can have resistance values kept large.

More specifically, for the third embodiment shown in FIG. 13, diodes 24 and 24B for limiting a current in direction are connected in series with turning-on gate resistors 12 and 12B, respectively. For this reason, in order not to change speeds of switching the elements when turning on the elements, the resistance values of turning-on gate resistors 12 and 12B have to be reduced. This is because the diode's transient, forward voltage drop exhibits the same effect as the gate resistor, and therefore, the gate resistor's resistance value needs to be reduced in advance accordingly. However, the diode's forward voltage drop in the steady state is smaller than that in the transient state, and when a turning-on operation of semiconductor switching elements 9 and 9B ends and thereafter RTC circuit 10 or 10B operates to lower the gate voltage of semiconductor switching element 9 or 9B, then, the operation monitoring circuit would receive a potential difference substantially smaller than that for the transient state. This results in a delayed protective operation. In the case of the fourth embodiment in FIG. 14, in contrast, diodes 24 and 24B for limiting a current in direction are not provided, and thus it is not necessary to reduce the resistance values of turning-on gate resistors 12 and 12B. Therefore, the protective operation is performed without delay.

Note that in the case of FIG. 14, differential amplifier 21 constituting differential voltage circuit 20 has the positive input terminal connected between a connection node 54 to which gate resistors 12 and 12B are commonly connected and output node 55 of gate driver 27.

(iv) In the semiconductor system of FIG. 14, diode 25 is provided between output node 55B of gate driver 27 and gate terminal 40 of semiconductor switching element 9 such that gate terminal 40 is located on the side of the anode thereof. Furthermore, diode 25B is provided between output node 55B of gate driver 27 and gate terminal 40B of semiconductor switching element 9B such that gate terminal 40B is located on the side of the anode thereof.

Diodes 25 and 25B are not intended to control a current in direction in switching the elements; rather, the diodes are provided so that when only one of RTC circuits 10 and 10B operates and the potential of the corresponding one of the gate terminals is lowered the other gate terminal is not affected thereby.

The remainder of FIG. 14 is the same as FIG. 11, and accordingly, identical or equivalent components are identically denoted and will not be described redundantly. Further, the circuit of the modification of differential voltage circuit 20 of operation monitoring circuit 11 described with reference to FIG. 12 is also applicable to the case of FIG. 14.

Thus, the semiconductor system of the fourth embodiment can achieve short circuit protection for a semiconductor switching element fast and accurately. In that case, short circuit protection can be achieved without delay, whether a short circuit may occur in only some of semiconductor switching elements connected in parallel or all of the semiconductor switching elements simultaneously. Further, the semiconductor system of the fourth embodiment can suppress an imbalance between currents when semiconductor switching elements turn off, and thus allows the elements to generate heat uniformly.

Fifth Embodiment

Figure 15:
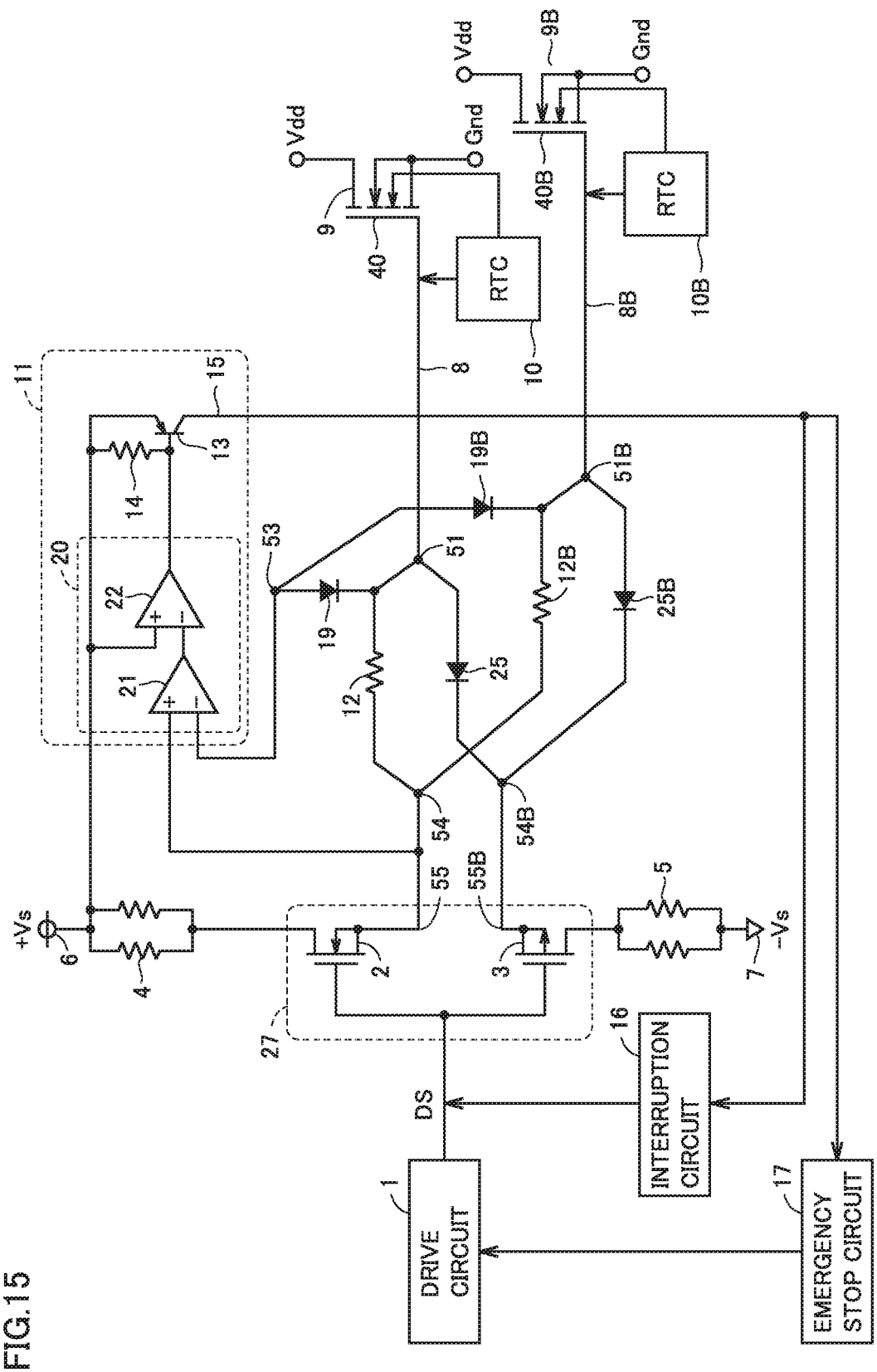
FIG. 15 is a circuit diagram showing a configuration of a semiconductor system comprising a short circuit protection circuit according to a fifth embodiment.

FIG. 15 is a circuit diagram showing a configuration of a semiconductor system comprising a short circuit protection circuit according to a fifth embodiment.

The semiconductor system of FIG. 15 differs from the semiconductor system of FIG. 14 in that a turning-on gate resistor 4 is further provided in series with transistor 2 and provided between positive power supply 6 and output node 55 of gate driver 27. That is, in the semiconductor system of FIG. 15, a turning-on gate resistor is divided, and some thereof is connected to gate terminals 40 and 40B of semiconductor switching elements 9 and 9B as gate resistors 12 and 12B and the remainder thereof is connected to positive power supply 6 of the gate driver as gate resistor 4.

This is done for the following reason: when there is a sufficient margin in the speed of the short circuit protection circuit, the turning-on gate resistor is partially unified to be shared by semiconductor switching elements 9 and 9B to reduce an effect of variation in value of gate resistance. Gate resistor 4 that is a unified gate resistor makes variation uniform, and as it also works for all semiconductor switching elements in common, it does not cause an imbalance of currents. This allows gate resistors 12 and 12B to be suppressed in magnitude to have a necessary minimum value, and an imbalance of currents caused when switching semiconductor switching elements to turn on them can minimized.

The remainder of FIG. 15 is the same as FIG. 14, and accordingly, identical or equivalent components are identically denoted and will not be described redundantly. The circuit of the modification of differential voltage circuit 20 described with reference to FIG. 12 is also applicable to the case of FIG. 15.

Thus, according to the semiconductor system of the fifth embodiment, in addition to the effect of the fourth embodiment, an imbalance of currents caused when turning on semiconductor switching elements can also be minimized.

It should be understood that the embodiments disclosed herein have been described for the purpose of illustration only and in a non-restrictive manner in any respect. The scope of the present invention is defined by the terms of the claims, rather than the description above, and is intended to include any modifications within the meaning and scope equivalent to the terms of the claims.

REFERENCE SIGNS LIST

2, 3 gate output transistor, 4, 5, 12, 12B, 23, 23B gate resistor, 6 positive power supply, 7 negative power supply, 8, 8B gate wiring, 9, 9B, 109, 109B semiconductor switching element, 10, 10B RTC circuit, 11 operation monitoring circuit, 13 PNP transistor, 14 resistive element, 15 collector terminal, 16 interruption circuit, 17 emergency stop circuit, 19, 19B, 24, 24B, 25, 25B diode, 20, 20A differential voltage circuit, 21 first differential amplifier, 22 second differential amplifier, 27 gate driver, 40, 40B gate terminal, 41 sense cell, 50, 55, 55B output node, 53 connection node, OPA operational amplifier, Out output terminal, Ref reference terminal, VinH high-potential input terminal (positive input terminal), VinL low-potential input terminal (negative input terminal).

The invention claimed is:

1. A short circuit protection circuit for a semiconductor switching element, the short circuit protection circuit protecting a first semiconductor switching element, the first semiconductor switching element having a first gate terminal and turned on by receiving a potential of a first power supply at the first gate terminal from a first output node of a gate driver, the short circuit protection circuit comprising:
   a first gate resistor connected between the first output node of the gate driver and the first gate terminal;
   a first real-time control circuit that operates to decrease a potential of the first gate terminal when the first real-time control circuit detects that a short circuit current passes through the first semiconductor switching element; and
   an operation monitoring circuit, the operation monitoring circuit including a differential voltage circuit configured to output a potential difference between a potential proportional to a potential difference across the first gate resistor and the potential of the first power supply, and monitoring, based on an output of the differential voltage circuit, whether the first real-time control circuit is in operation.

2. The short circuit protection circuit for a semiconductor switching element according to claim 1, the short circuit protection circuit protecting a second semiconductor switching element, the second semiconductor switching element having a second gate terminal and turned on by receiving the potential of the first power supply at the second gate terminal from the first output node of the gate driver, the short circuit protection circuit further comprising:
   a second gate resistor connected between the first output node of the gate driver and the second gate terminal; and
   a second real-time control circuit that operates to decrease a potential of the second gate terminal when the second real-time control circuit detects that a short circuit current passes through the second semiconductor switching element,
   wherein the differential voltage circuit is further configured to output a potential difference between a potential proportional to a potential difference across the second gate resistor and the potential of the first power supply.

3. The short circuit protection circuit for a semiconductor switching element according to claim 2, further comprising:
   a first diode connected to the first gate terminal such that the first gate terminal is located on a side of a cathode thereof;
   a second diode connected to the second gate terminal such that the second gate terminal is located on a side of a cathode thereof; and
   a connection node to which an anode of the first diode and an anode of the second diode are connected in common,
   wherein the differential voltage circuit is configured to output a voltage proportional to a potential difference between the first output node of the gate driver and the connection node, as a potential difference from the first power supply.

4. The short circuit protection circuit for a semiconductor switching element according to claim 3, wherein
   the differential voltage circuit includes:
   a first differential amplifier having a positive input terminal connected to the first output node of the gate driver, a negative input terminal connected to the connection node, and an output terminal outputting a potential difference of a potential of the positive input terminal minus a potential of the negative input terminal; and
   a second differential amplifier having a positive input terminal connected to the first power supply, a negative input terminal connected to the output terminal of the first differential amplifier, and an output terminal outputting a potential difference of a potential of the positive input terminal minus a potential of the negative input terminal and multiplied by a constant, and
   the operation monitoring circuit monitors, based on a potential of the output terminal of the second differential amplifier, whether the first real-time control circuit is in operation.

5. The short circuit protection circuit for a semiconductor switching element according to claim 4, wherein
   the operation monitoring circuit further includes a PNP transistor having a base terminal connected to the output terminal of the second differential amplifier and an emitter terminal connected to the first power supply, and a signal representing whether the first and second real-time control circuits are in operation is output from a collector terminal of the PNP transistor.

6. The short circuit protection circuit for a semiconductor switching element according to claim 3, wherein
the differential voltage circuit includes a first differential amplifier having a negative input terminal connected to the first output node of the gate driver, a positive input terminal connected to the connection node, a reference terminal connected to the first power supply, and an output terminal outputting a potential difference of a potential of the positive input terminal minus a potential of the negative input terminal multiplied by a constant plus a potential of the reference terminal, and
the operation monitoring circuit monitors, based on a potential of the output terminal of the first differential amplifier, whether the first real-time control circuit is in operation.

7. The short circuit protection circuit for a semiconductor switching element according to claim 6, wherein
the operation monitoring circuit further includes a PNP transistor having a base terminal connected to the output terminal of the first differential amplifier and an emitter terminal connected to the first power supply, and
a signal representing whether the first and second real-time control circuits are in operation is output from a collector terminal of the PNP transistor.

8. The short circuit protection circuit for a semiconductor switching element according to claim 2, further comprising:
a third gate resistor connected parallel to the first gate resistor and connected between the first output node of the gate driver and the first gate terminal;
a fourth gate resistor connected parallel to the second gate resistor and connected between the first output node of the gate driver and the second gate terminal;
a third diode connected in series with the first gate resistor and connected between the first output node of the gate driver and the first gate terminal such that the first gate terminal is located on a side of a cathode thereof;
a fourth diode connected in series with the third gate resistor and connected between the first output node of the gate driver and the first gate terminal such that the first gate terminal is located on a side of an anode thereof,
a fifth diode connected in series with the second gate resistor and connected between the first output node of the gate driver and the second gate terminal such that the second gate terminal is located on a side of a cathode thereof; and
a sixth diode connected in series with the fourth gate resistor and connected between the first output node of the gate driver and the second gate terminal such that the second gate terminal is located on a side of an anode thereof.

9. The short circuit protection circuit for a semiconductor switching element according to claim 2, wherein
the gate driver includes:
the first output node;
a first transistor connected between the first output node and the first power supply;
a second output node different from the first output node; and
a second transistor connected between the second output node and a second power supply, and
the short circuit protection circuit further comprises:
a fifth gate resistor connected in series with the second transistor and connected between the second output node and the second power supply;
a seventh diode connected between the first gate terminal and the second output node such that the first gate terminal is located on a side of an anode thereof, and
an eighth diode connected between the second gate terminal and the second output node such that the second gate terminal is located on a side of an anode thereof.

10. The short circuit protection circuit for a semiconductor switching element according to claim 9, further comprising a sixth gate resistor connected in series with the first transistor and connected between the first output node and the first power supply.

* * * * *